United States Patent [19]

Tomita et al.

[11] Patent Number: 5,666,008
[45] Date of Patent: Sep. 9, 1997

[54] FLIP CHIP SEMICONDUCTOR DEVICE

[75] Inventors: Yoshihiro Tomita; Akiyoshi Sawai, both of Tokyo; Katsunori Asai, Hyogo, all of Japan

[73] Assignees: Mitsubishi Denki Kabushiki Kaisha, Tokyo; Ryoden Semiconductor System Engineering Corporation, Hyogo, both of Japan

[21] Appl. No.: 708,559

[22] Filed: Sep. 6, 1996

[30] Foreign Application Priority Data

Mar. 27, 1996 [JP] Japan ................. 8-072215

[51] Int. Cl.⁶ .................. H01L 23/48; H01L 23/52
[52] U.S. Cl. .................. 257/778; 257/780; 257/737
[58] Field of Search .................. 257/778, 780, 257/737

[56] References Cited

U.S. PATENT DOCUMENTS

| 3,380,155 | 4/1968 | Burks | 257/778 |
|---|---|---|---|
| 4,871,921 | 10/1989 | Gurnee | 257/737 |
| 5,461,197 | 10/1995 | Hiruta et al. | 257/778 |
| 5,471,096 | 11/1995 | Papathomas et al. | 257/778 |
| 5,550,408 | 8/1996 | Kunitomo et al. | 257/737 |

FOREIGN PATENT DOCUMENTS

| 4131413 | 10/1992 | Germany | 257/778 |
|---|---|---|---|
| 6112463 | 4/1994 | Japan | 257/778 |

OTHER PUBLICATIONS

IBM TDB vol. 38 No. 07 Jul. 1995 "Repairable Plastic Ball Grid Array Package", pp. 265–266.

*Primary Examiner*—Mahshid D. Saadat
*Assistant Examiner*—T. M. Arroyo
*Attorney, Agent, or Firm*—Leydig, Voit & Mayer

[57] ABSTRACT

A semiconductor device for life enhancement of electrical connections between a semiconductor chip and a mounting substrate. Protruding electrodes, each including a bump electrode and a land electrode, are located on the lower surface of an LSI chip. The bump electrodes are substantially spherical and have a first thickness. Connecting terminals of substantially spherical configuration and having a second thickness are directly connected to corresponding land electrodes by melting. Connecting patterns are located on the upper surface of a wiring board which is larger in area than the LSI chip in plan configuration, and external electrodes, each including a connecting pattern and an external electrode, are located on the lower surface of the wiring board. The external electrodes are substantially spherical and have a third thickness. The connecting patterns are directly connected to corresponding connecting terminals, respectively, by melting.

18 Claims, 3 Drawing Sheets

FLIP CHIP SEMICONDUCTOR DEVICE

BACKGROUND OF THE INVENTION

1. Field of the Invention

The present invention relates to a flip chip semiconductor device having a semiconductor chip packaged therein.

2. Description of the Background Art

FIG. 6 is a cross-sectional view of a conventional flip chip semiconductor device having a semiconductor chip packaged therein. As shown in FIG. 6, a plurality of protruding electrode portions 20 each including a bump electrode 2 and a land electrode 3 are formed on the lower surface of an LSI chip 1. The bump electrodes 2 are electrically connected to electrodes of the LSI chip 1 although not shown in FIG. 6.

The LSI chip 1, the plurality of bump electrodes 2 and the plurality of land electrodes 3 are sealed in a resin 4. The land electrodes 3 are exposed at the lower interface of the resin 4. The plurality of land electrodes 3 and a plurality of connecting terminals 5 are directly connected respectively to each other by melting through the application of heat. In this manner, a signal from the electrodes of the LSI chip 1 may be provided through the connecting terminals 5. The connecting terminals 5 are terminals for connection to a mounting substrate. The structure of FIG. 6 is disclosed in, for example, Japanese Patent Application Laid-Open No. 6-302604 (1994).

As illustrated in FIG. 6, the flip chip semiconductor device including the LSI chip 1 packaged therein has a high packaging density to achieve size reduction and high functions at low costs.

In specific applications, for example, when a semiconductor device packaged by a conventional manner such as wire bonding is replaced with the flip chip semiconductor device connecting terminals of the mounting substrate are not packaged at a high density in the majority of cases.

In such a case, it is impossible to use the flip chip semiconductor device since the connecting terminals of the semiconductor device packaged at a high density by the flip chip technique are not compatible with the connecting terminals of the mounting substrate packaged at a low density.

Additionally, the thermal stress caused by the difference in thermal expansion coefficient between the LSI chip 1 and the mounting substrate exerts adverse effects on electrically connecting means (the bump electrodes 2, the land electrodes 3 and the connecting terminals 5) formed between the LSI chip 1 and the mounting substrate, resulting in a shortened life due to fatique.

SUMMARY OF THE INVENTION

According to a first aspect of the present invention, a semiconductor device comprises: a semiconductor chip having first and second major surfaces, the semiconductor chip including a plurality of protruding electrode portions having a first thickness and formed on the second major surface thereof; a plurality of connecting terminals having a second thickness and directly connected to corresponding ones of the plurality of protruding electrode portions, respectively; a resin formed to cover the second major surface of the semiconductor chip including the plurality of protruding electrode portions; and a connecting board having first and second major surfaces, the connecting board including a plurality of electrode regions formed on the first major surface thereof, and a plurality of external electrode portions having a third thickness and formed on the second major surface thereof, the plurality of electrode regions being electrically connected to corresponding ones of the plurality of external electrode portions and directly connected to corresponding ones of the plurality of connecting terminals, respectively.

Preferably, according to a second aspect of the present invention, the connecting board is greater in area than the semiconductor chip in plan configuration; and the spacing between adjacent ones of the external electrode portions is greater than the spacing between adjacent ones of the protruding electrode portions.

Preferably, according to a third aspect of the present invention, each of the protruding electrode portions includes at its forward end a flat conductive pattern formed at an interface of the resin, the conductive patterns of the protruding electrode portions being directly connected to corresponding ones of the connecting terminals, respectively.

Preferably, according to a fourth aspect of the present invention, the resin is also formed on the first major surface of the connecting board including the connecting terminals and the electrode regions.

Preferably, according to a fifth aspect of the present invention, the relationship T1>T2≧T3 is satisfied where T1, T2, and T3 are melting points of major portions of the protruding electrode portions, the connecting terminals, and the external electrode portions, respectively.

Preferably, according to a sixth aspect of the present invention, major portions of the protruding electrode portions are made of a first material having a melting point T1, and major portions of the external electrode portions are made of a second material having a melting point T2 (T2<T1); and each of the connecting terminals includes a first region made of the first material, and a second region made of the second material, the first regions of the connecting terminals being directly connected to corresponding ones of the protruding electrode portions, respectively.

Preferably, according to a seventh aspect of the present invention, the semiconductor device further comprises: a second semiconductor chip having first and second major surfaces, the second semiconductor chip including a plurality of second protruding electrode portions having the first thickness and formed on the second major surface thereof; a plurality of second connecting terminals having the second thickness and directly connected to corresponding ones of the plurality of second protruding electrode portions, respectively; and a second resin formed to cover the second major surface of the second semiconductor chip including the plurality of second protruding electrode portions, the connecting board further including a plurality of second electrode regions formed on the first major surface thereof, and a plurality of second external electrode portions having the third thickness and formed on the second major surface thereof, the plurality of second electrode regions being electrically connected to corresponding ones of the second external electrode portions and directly connected to corresponding ones of the plurality of second connecting terminals, respectively.

As above stated, the semiconductor device in accordance with the first aspect of the present invention comprises the protruding electrode portions, the connecting terminals, and the external electrode portions having the first, second, and third thicknesses, respectively, and used as means for electrically connecting the mounting substrate and the semiconductor chip.

When the semiconductor device is mounted on the mounting substrate, the thermal stress caused by the difference in thermal expansion coefficient between the semiconductor chip and the mounting substrate may be distributed between the protruding electrode portions, the connecting terminals, and the external electrode portions, and the connecting board itself also functions as a cushioning against the thermal stress. Consequently, the semiconductor device is provided which is intended for fatigue life enhancement of the electrically connecting means formed between the semiconductor chip and the mounting substrate.

Additionally, the external electrode portions may be formed on the second major surface of the connecting board without being limited by the physical position relative to the protruding electrode portions and the connecting terminals. This increases design flexibility during the formation of the external electrode portions, achieving the semiconductor device permitted to be placed on the desired mounting substrate.

The resin is formed to cover the second major surface of the semiconductor chip including the protruding electrode portions to suppress the thermal fatigue of the protruding electrode portions. Therefore, the reliability of the device is enhanced.

In accordance with the semiconductor device of the second aspect of the present invention, the connecting board is greater in area than the semiconductor chip in plan configuration, and the spacing between adjacent ones of the external electrode portions is greater than the spacing between adjacent ones of the protruding electrode portions. Thus, the external electrodes may be of a relatively large size.

Consequently, the external electrode portions may have increased strength to withstand the thermal stress. This accomplishes the semiconductor device which is intended for further fatigue life enhancement of the electrically connecting means formed between the semiconductor chip and the mounting substrate.

In accordance with the semiconductor device of the third aspect of the present invention, each of the protruding electrode portions has at its forward end the flat conductive pattern formed at the interface of the resin, and the conductive patterns of the protruding electrode portions are directly connected to the connecting terminals, respectively. Thus, the connecting terminals may be formed on the conductive patterns without variations in height and configuration.

In accordance with the semiconductor device of the fourth aspect of the present invention, the resin is also formed on the first major surface of the connecting board including the connecting terminals and the electrode regions to suppress the thermal fatigue of the connecting terminals, providing further improved reliability of the device.

In accordance with the semiconductor device of the fifth aspect of the present invention, the relationship T1>T2≧T3 is satisfied where T1, T2, and T3 are the melting points of the major portions of the protruding electrode portions, connecting terminals, and external electrode portions, respectively. When the external electrode portions are mounted on the mounting substrate by melting through the application of heat, the heating temperature may be limited below the melting point T1, preventing at least the protruding electrode portions from being melted by mistake.

In accordance with the semiconductor device of the sixth aspect of the present invention, the major portions of the protruding electrode portions are made of the first material having the melting point T1, and the major portions of the external electrode portions are made of the second material having the melting point T2 (T2<T1). Each of the connecting terminals includes the first region made of the first material, and the second region made of the second material. The first regions of the connecting terminals are directly connected to corresponding ones of the protruding electrode portions. Thus, when the external electrode portions are mounted on the mounting substrate by melting through the application of heat, the heating temperature may be limited below the melting point T1, preventing the first regions of the connecting terminals and the protruding electrode portions from being melted by mistake.

Additionally, only two materials (the first and second materials) are required to form the major portions of the protruding electrode portions, the connecting terminals, and the major portions of the external electrode portions. This reduces the costs required to assemble the semiconductor device.

The semiconductor device in accordance with the seventh aspect of the present invention further comprises: the second semiconductor chip including the plurality of second protruding electrode portions, the plurality of second connecting terminals directly connected respectively to the second protruding electrode portions, and the second resin formed to cover the second major surface of the second semiconductor chip including the plurality of second protruding electrode portions. The connecting board includes the plurality of second electrode regions formed on the first major surface thereof, and the plurality of second external electrode portions having the third thickness and formed on the second major surface thereof. The second electrode regions are electrically connected to corresponding ones of the second external electrode portions, respectively. The second electrode regions are directly connected to corresponding ones of the second connecting terminals, respectively.

Consequently, the single semiconductor device is provided which has the two semiconductor chips formed on the single connecting board.

It is therefore an object of the present invention to provide a semiconductor device intended for fatigue life enhancement of electrically connecting means formed between a semiconductor chip and a mounting substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

<<First Preferred Embodiment>>
<First Mode>

Figure 1:
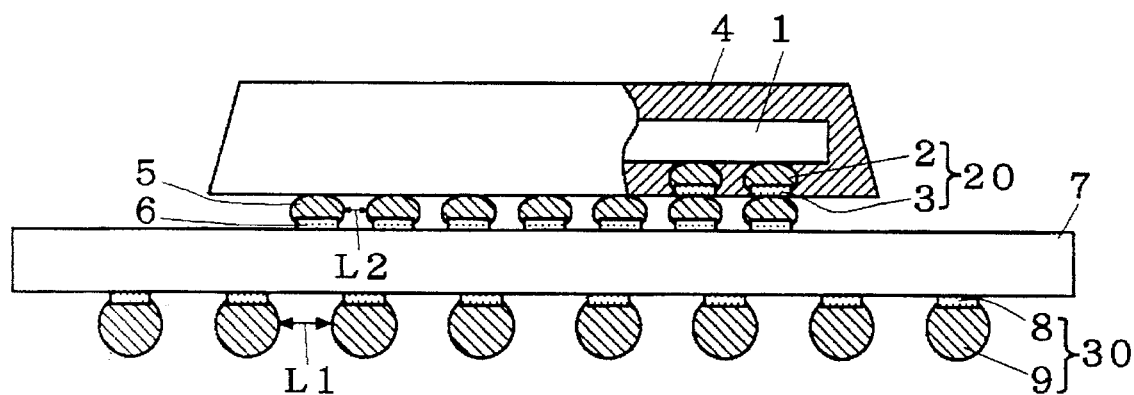
FIG. 1 is a cross-sectional view of a semiconductor device according to a first mode of a first preferred embodiment of the present invention.

FIG. 1 is a cross-sectional view of a semiconductor device according to a first mode of a first preferred embodiment of the present invention. As shown in FIG. 1, a plurality of protruding electrode portions 20 each including a bump electrode 2 and a land electrode 3 are located on the lower surface of an LSI chip 1. The plurality of land electrodes 3 are thin and very flat, and the plurality of bump electrodes 2 are of substantially spherical configuration, having a first thickness which is significantly larger than the thickness of the land electrodes 3. The plurality of bump electrodes 2 are electrically connected to corresponding electrodes (not shown in FIG. 1) of the LSI chip 1, respectively.

A plurality of connecting terminals 5 of substantially spherical configuration having a second thickness which is significantly larger than the thickness of connecting patterns 6 to be described later is provided in corresponding relation to the plurality of protruding electrode portions 20. The connecting terminals 5 are directly connected to corresponding land electrodes 3, respectively, by melting, through the application of heat.

The LSI chip 1 including the plurality of protruding electrode portions 20 (the bump electrodes 2 and the land electrodes 3) are sealed in a resin 4. The land electrodes 3 and the connecting terminals 5 are connected to each other at the lower interface of the resin 4.

The plurality of thin, very flat connecting patterns 6 are formed on the upper surface of a wiring board (connecting board) 7, and a plurality of external electrode portions 30 each including a connecting pattern 8 and an external electrode 9 are located on the lower surface of the wiring board 7. The connecting patterns 8 are thin and very flat, and the external electrodes 9 are of substantially spherical configuration, having a third thickness which is significantly larger than the thickness of the connecting patterns 8. The connecting patterns 6 are electrically connected to corresponding connecting patterns 8, respectively, by interconnecting means (not shown in FIG. 1) such as through holes formed in the wiring board 7.

The plurality of connecting patterns 6 are directly connected to corresponding connecting terminals 5, respectively, by melting, through the application of heat.

The wiring board 7 is larger in area than the LSI chip 1 in plan configuration. The spacing L1 between adjacent external electrode portions 30 is significantly longer than the spacing L2 between adjacent protruding electrode portions 20. The external electrode portions 30 (the connecting patterns 8 and the external electrodes 9) are significantly larger in size than the protruding electrode portions 20 (the bump electrodes 2 and the land electrodes 3) and the connecting terminals 5.

The bump electrodes 2, the land electrodes 3, the connecting terminals 5, the connecting patterns 6, the connecting patterns 8, and the external electrodes 9 are made of metal. More specifically, the bump electrodes 2, the connecting terminals 5, and the external electrodes 9 are made of solder or the like, and the land electrodes 3, the connecting patterns 6, and the connecting patterns 8 are made of copper or the like. The wiring board 7 may be, for example, a glass fiber reinforced epoxy resin substrate, or a polyimide tape.

The semiconductor device having such a construction is placed on a mounting substrate, and then the external electrodes 9 of the external electrode portions 30 are connected to corresponding connecting terminals on the mounting substrate, respectively, by melting, through the application of heat. This process mounts the semiconductor device on the mounting substrate.

In the semiconductor device of the first mode of the first aspect of the present invention, the protruding electrode portions 20, connecting terminals 5, and external electrode portions 30 which have the first, second, and third thicknesses, respectively, are used as means for electrically connecting the mounting substrate and the LSI chip 1 together.

Thus, when the semiconductor device of the first mode of the first preferred embodiment is mounted on the mounting substrate, the thermal stress caused by the difference in thermal expansion coefficient between the LSI chip 1 and the mounting substrate is distributed between the protruding electrode portions 20 (the bump electrodes 2 and the land electrodes 3), the connecting terminals 5 (the connecting patterns 6), and the external electrode portions 30 (the connecting patterns 8 and the external electrodes 9), and the wiring board 7 itself functions as a cushion against the thermal stress. The result is the enhanced life of the electrically connecting means between the LSI chip 1 and the mounting substrate (a first effect).

Additionally, the plurality of external electrode portions 30 may be provided in any position on the lower surface of the wiring board 7 without being limited by the physical positions of to the protruding electrode portions 20 and connecting terminals 5. This increases design flexibility during the formation of the external electrode portions 30, achieving a semiconductor device which can be placed on the desired mounting substrate (a second effect). Therefore, the external electrode portions 30 may be disposed on the lower surface of the wiring board 7 in compatible relation to the connecting terminals of the mounting substrate for a semiconductor device having a conventional construction with a low packaging density.

The resin 4 covers the lower surface of the LSI chip 1 including the protruding electrode portions 20 to suppress the thermal fatigue of the protruding electrode portions 20. This improves the reliability of the device (a third effect).

In the semiconductor device of the first mode of the first preferred embodiment, the wiring board 7 is larger in area than the LSI chip 1 in plan configuration, and the spacing between adjacent external electrode portions 30 is greater than the spacing between adjacent protruding electrode portions 20. Thus, the plurality of external electrodes 9 may have a relatively large size.

Consequently, the external electrode portions 30 have increased strength to withstand thermal stress. This provides a semiconductor device intended for further life enhancement of the electrically connecting means between the LSI chip 1 and the mounting substrate (a fourth effect).

Further, in the semiconductor device of the first mode of the first preferred embodiment, each of the protruding electrode portions 20 has the land electrode 3 formed at its forward end, and the land electrodes 3 having excellent planarity are formed at the interface of the resin 4. Since the land electrodes 3 of the protruding electrode portions 20 are directly connected to the connecting terminals 5, respectively, by melting, through the application of heat, the connecting terminals 5 directly connected to the land electrodes 3 may be formed without variations in height and configuration.

The configurations of the bump electrodes 2, the connecting terminals 5, and the external electrodes 9 are substantially spherical in the first mode of the first preferred embodiment but are not limited thereto. The bump electrodes 2, the connecting terminals 5, and the external electrodes 9 should be shaped to have a predetermined thickness, such as a branch-like pin. The wiring board 7 is not limited to the above described glass fiber reinforced epoxy resin substrate or polyimide tape. The material of the wiring board 7 is not greatly limited. For example, glass fiber reinforced plastic may be used for the wiring board 7.

<Second Mode>

Figure 2:
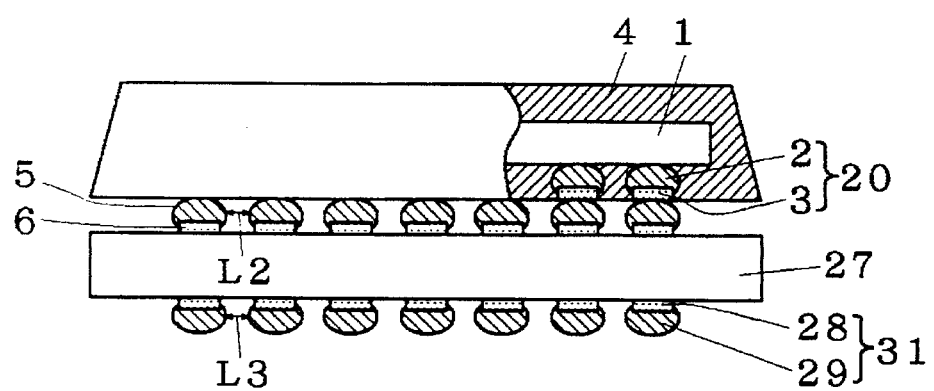
FIG. 2 is a cross-sectional view of a second mode of the first preferred embodiment.

FIG. 2 is a cross-sectional view of the semiconductor device according to a second mode of the first preferred embodiment of the present invention. As shown in FIG. 2, a plurality of external electrode portions 31 each including a connecting pattern 28 and an external electrode 29 are formed on the lower surface of a wiring board 27. The plurality of connecting patterns 28 are thin and very flat, and the external electrodes 29 are of substantially spherical configuration having a third thickness which is significantly larger than the thickness of the connecting patterns 28. The plurality of connecting patterns 6 are electrically connected to corresponding connecting patterns 28, respectively, by interconnecting means (not shown in FIG. 2) formed in the wiring board 27. The plurality of connecting patterns 6 are directly connected to corresponding connecting terminals 5, respectively, by melting, through the application of heat.

The wiring board 27 is substantially coextensive with the LSI chip 1 in plan configuration. The spacing L3 between adjacent external electrode portions 31 is substantially equal in distance to the spacing L2 between adjacent protruding electrode portions 20. The external electrode portions 31 (the connecting patterns 28 and the external electrodes 29) are substantially equal in size to the protruding electrode portions 20 (the bump electrodes 2 and the land electrodes 3) and the connecting terminals 5. Other components of the second mode are similar to those of the first mode shown in FIG. 1.

The semiconductor device of the second mode having the described structure provides the first to third effects of the semiconductor device of the first mode. An additional advantage of the semiconductor device of the second mode is that a high density is maintained since the wiring board 27 is substantially coextensive with the LSI chip 1 in plan configuration and the spacing L3 between adjacent external electrode portions 31 is equal in distance to the spacing L2 between adjacent protruding electrode portions 20.

The configurations of the bump electrodes 2, the connecting terminals 5, and the external electrodes 29 are substantially spherical in the second mode of the first preferred embodiment but are not limited thereto. The bump electrodes 2, the connecting terminals 5, and the external electrodes 29 should be shaped to have a predetermined thickness, such as a branch-like pin. The wiring board 27 is not limited to the glass fiber reinforced epoxy resin substrate and polyimide tape. The material of the wiring board 27 is not greatly limited. For example, glass fiber reinforced plastic may be used for the wiring board 27.

<<Second Preferred Embodiment>>

Figure 3:
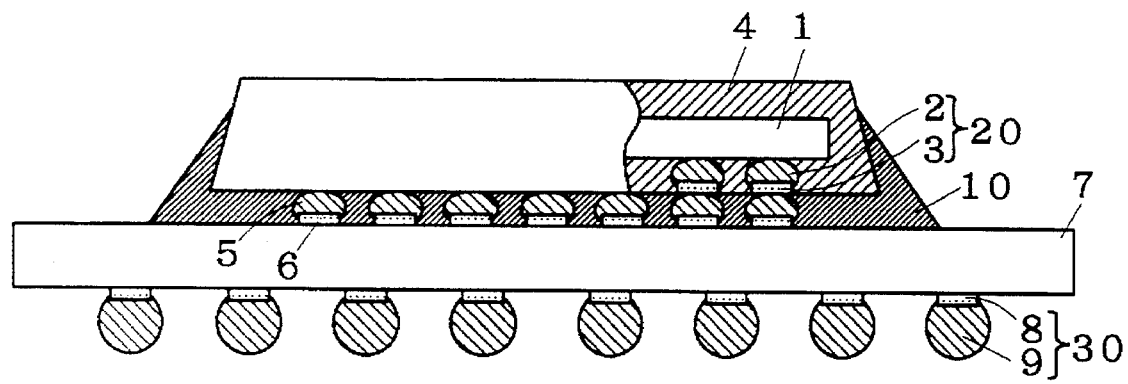
FIG. 3 is a cross-sectional view of the semiconductor device according to a second preferred embodiment of the present invention.

FIG. 3 is a cross-sectional view of the semiconductor device according to a second preferred embodiment of the present invention. As shown in FIG. 3, the semiconductor device further comprises a resin 10 formed on the upper surface of the wiring board 7 including the connecting terminals 5 and the connecting patterns 6 in addition to the resin 4. Other components of the semiconductor device of the second preferred embodiment are similar to those of the semiconductor device of the first mode of the first preferred embodiment shown in FIG. 1. The resin 10 is formed by a second resin sealing process after the structure of FIG. 1 is obtained.

The semiconductor device of the second preferred embodiment having the described structure wherein the resin 10 is formed on the upper surface of the wiring board 7 including the connecting terminals 5 and the connecting patterns 6 suppresses thermal fatigue of the connecting terminals 5 to provide accordingly improved reliability.

<<Third Preferred Embodiment>>

<First Mode>

The semiconductor device according to a first mode of a third preferred embodiment of the present invention is similar in construction to that of the first mode of the first preferred embodiment shown in FIG. 1.

The difference is that the semiconductor device of the first mode of the third preferred embodiment is adapted such that the relationship T1>T2>T3 is satisfied where T1 is the melting point of the bump electrodes 2 which are major portions of the protruding electrode portions 20, T2 is the melting point of the connecting terminals 5, and T3 is the melting point of the external electrodes 9 which are major portions of the external electrode portions 30.

In the semiconductor device of the first mode of the third preferred embodiment having the above stated structure, when the external electrodes 9 are melted through the application of heat and mounted on the mounting substrate, the heating temperature TH is limited to below the melting point T2 to prevent the connecting terminals 5 and the bump electrodes 2 from being melted by mistake. The relationship T1>T2>T3 is satisfied where T1, T2, T3 are the melting points of the bump electrodes 2, the connecting terminals 5, and the external electrodes 9, respectively.

The structure of the first mode is shown as employing the structure of FIG. 1, but the first mode is applicable to the structure of the second mode of the first preferred embodiment shown in FIG. 2 or the structure of the second preferred embodiment shown in FIG. 3.

In the first mode of the third preferred embodiment, the relationship T1>T2>T3 is satisfied where T1, T2, T3 are the melting points of the bump electrodes 2, the connecting terminals 5, and the external electrodes 9. However, at a minimum, the relationship T1>T2≧T3 should be satisfied in order to prevent the bump electrodes 2 from being melted by mistake by limiting the heating temperature TH below the melting point T1 when the external electrodes 9 are melted by the application of heat and mounted on the mounting substrate.

<Second Mode>

Figure 4:
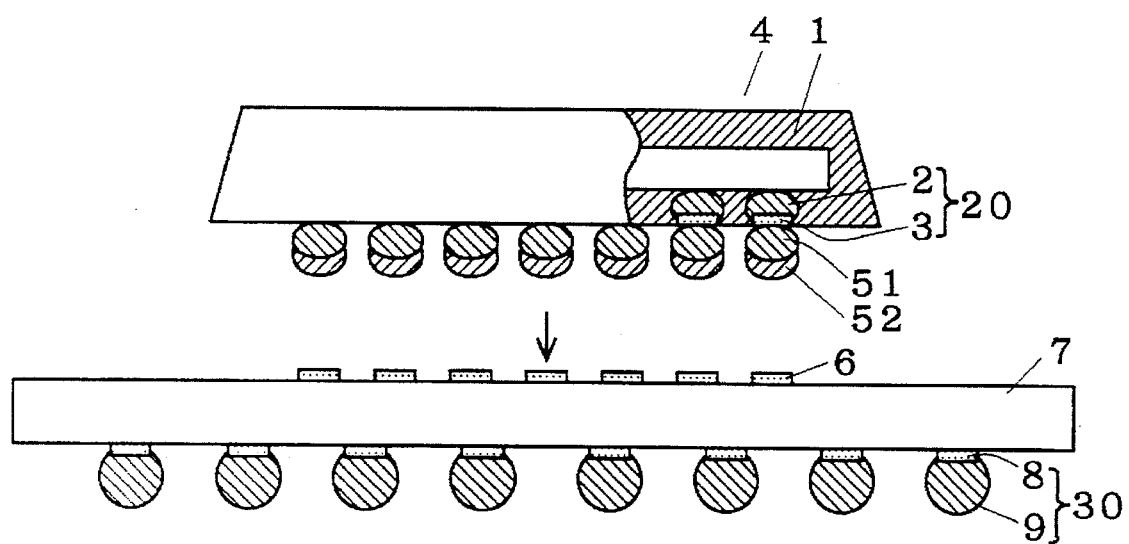
FIG. 4 schematically illustrates the semiconductor device according to a second mode of a third preferred embodiment of the present invention.

FIG. 4 schematically illustrates the semiconductor device according to a second mode of the third preferred embodiment of the present invention. As shown in FIG. 4, each of the plurality of connecting terminals 5 comprises a first region 51 and a second region 52. The first regions 51 are directly connected to the land electrodes 3 of the protruding electrode portions 20, respectively. The second regions 52 are directly connected to the connecting patterns 6, respectively.

The first regions 51 are made of the same metal material as the bump electrodes 2, and the second regions 52 are made of the same metal material as the external electrodes 9. The metal materials are selected so that the relationship T1>T2 is satisfied where T1 is the melting point of the metal material of the bump electrodes 2 which are major portions of the protruding electrode portions 20 and T2 is the melting point of the metal material of the external electrodes 9 which are major portions of the external electrode portions 30.

In the semiconductor device of the second mode of the third preferred embodiment of the present invention having the described structure, when the external electrodes 9 are mounted on the mounting substrate by melting, through the application of heat, the bump electrodes 2 and the first regions 51 of the connecting terminals 5 are prevented from being melted by mistake since the relationship T1>T2 is satisfied where T1 and T2 are the melting points of the bump electrodes 2 and the external electrodes 9, respectively.

Additionally, only two metal materials are required to form the major portions (the bump electrodes 2) of the protruding electrode portions 20, the connecting terminals 5, and the major portions (the external electrodes 9) of the external electrode portions 30. This reduces the costs required to assemble the semiconductor device.

<<Fourth Preferred Embodiment>>

Figure 5:
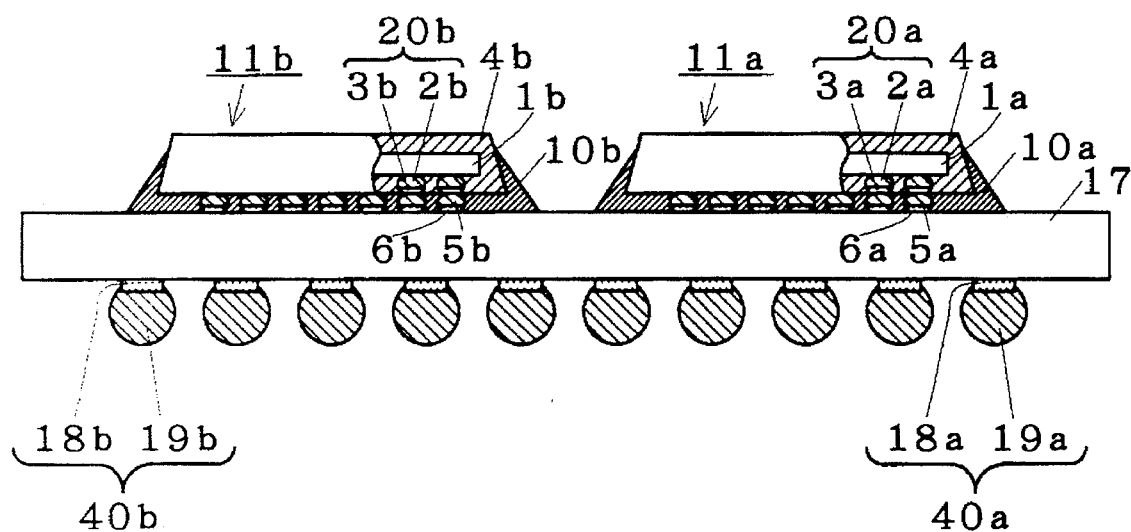
FIG. 5 is a cross-sectional view of the semiconductor device according to a fourth preferred embodiment of the present invention.
Figure 6:
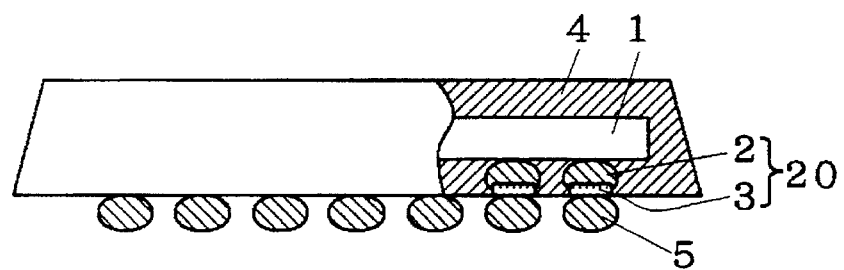
FIG. 6 is cross-sectional view of a conventional semiconductor device.

FIG. 5 is a cross-sectional view of the semiconductor device according to a fourth preferred embodiment of the present invention. As shown in FIG. 5, a plurality of thin, very flat connecting patterns 6a, 6b are formed on the upper surface of a wiring board 17, and a plurality of external electrode portions 40a each including a connecting pattern 18a and an external electrode 19a and a plurality of external electrode portions 40b each including a connecting pattern 18b and an external electrode 19b are formed on the lower surface of the wiring board 17. The connecting patterns 18a, 18b are thin and very flat. The external electrodes 19a, 19b are of substantially spherical configuration, having the third thickness which is significantly larger than the thickness of the connecting patterns 18a, 18b. Interconnecting means (not shown in FIG. 5) establishes electrical connection between the connecting patterns 6a and corresponding connecting patterns 18a and between the connecting patterns 6b and corresponding connecting patterns 18b, respectively.

Semiconductor portions 11a and 11b are placed respectively on the connecting patterns 6a and 6b on the upper surface of the wiring board 17. Specifically, the connecting patterns 6a are directly connected to corresponding connecting terminals 5a of an LSI chip 1a, respectively, and the connecting patterns 6b are directly connected to corresponding connecting terminals 5b of an LSI chip 1b, respectively.

The semiconductor portion 11a comprises the LSI chip 1a, protruding electrode portions 20a (bump electrodes 2a and land electrodes 3a), a resin 4a, the connecting terminals 5a, and a resin 10a which are similar in construction to those of the second preferred embodiment shown in FIG. 3 (the LSI chip 1, the protruding electrode portions 20 (the bump electrodes 2 and the land electrodes 3), the resin 4, the connecting terminals 5, and the resin 10).

The semiconductor portion 11b comprises the LSI chip 1b, protruding electrode portions 20b (bump electrodes 2b and land electrodes 3b), a resin 4b, the connecting terminals 5b, and a resin 10b which are similar in construction to those of the second preferred embodiment shown in FIG. 3 (the LSI chip 1, the protruding electrode portions 20 (the bump electrodes 2 and the land electrodes 3), the resin 4, the connecting terminals 5, and the resin 10).

The fourth preferred embodiment constructed as described provides a single semiconductor device including the two LSI chips 1a and 1b formed on the single wiring board 17.

While the invention has been described in detail, the foregoing description is in all aspects illustrative and not restrictive. It is understood that numerous other modifications and variations can be devised without departing from the scope of the invention.

We claim:

1. A semiconductor device comprising:
   a semiconductor chip having a first major surface and a second major surface, said semiconductor chip including a plurality of protruding electrodes having a first thickness and disposed on the second major surface;
   a plurality of connecting terminals having a second thickness and directly connected to corresponding protruding electrodes;
   a resin covering the second major surface of said semiconductor chip and said plurality of protruding electrodes; and
   a connecting board having a larger area than said semiconductor chip, said connecting board having a first major surface and a second major surface, said connecting board including a plurality of electrode regions on the first major surface of said connecting board and a plurality of external electrodes having a third thickness on the second major surface of said connecting board, said electrode regions being electrically connected to corresponding external electrodes and directly connected to corresponding connecting terminals, adjacent external electrodes of said connecting board being farther apart than adjacent protruding electrodes of said semiconductor chip.

2. The semiconductor device of claim 1, wherein said resin entirely covers said semiconductor chip.

3. The semiconductor device of claim 1, wherein each of said protruding electrodes includes a forward end, each forward end including a flat conductive pattern at a surface of said resin, said conductive patterns of said protruding electrodes being directly connected to corresponding connecting terminals.

4. The semiconductor device of claim 3, wherein each of said electrode regions includes a second conductive pattern and each of said external electrodes includes a third conductive pattern directly connected to the second major surface of said connecting board.

5. The semiconductor device of claim 3, wherein said resin is disposed on the first major surface of said connecting board covering said connecting terminals and said electrode regions.

6. The semiconductor device of claim 1, wherein T1>T2>T3 and T1, T2, and T3 are the melting points of portions of said protruding electrodes, said connecting terminals, and said external electrodes, respectively.

7. The semiconductor device of claim 1, wherein major portions of said protruding electrodes are a first material having a melting point T1, major portions of said external electrodes are a second material having a melting point T2, T2<T1, each of said connecting terminals includes a first region of said first material and a second region of said second material, and said first regions of said connecting terminals are directly connected to corresponding protruding electrodes.

8. The semiconductor device of claim 1, comprising:
   a second semiconductor chip having a first major surface and a second major surface, said second semiconductor chip including a plurality of second protruding electrodes having the first thickness and disposed on the second major surface of said second semiconductor chip;
   a plurality of second connecting terminals having the second thickness and directly connected to corresponding second protruding electrodes; and a second resin covering the second major surface of said second semiconductor chip and said plurality of protruding electrodes, said connecting board including a plurality of second electrode regions on the first major surface of said connecting board and a plurality of second external electrodes having the third thickness and disposed on the second major surface of said connecting board, said plurality of second electrode regions being electrically connected to corresponding second external electrodes and directly connected to corresponding second connecting terminals.

9. A semiconductor device comprising:

a semiconductor chip having a first major surface and a second major surface, said semiconductor chip including a plurality of protruding electrodes having a first thickness and disposed on the second major surface;

a plurality of connecting terminals having a second thickness and directly connected to corresponding protruding electrodes;

a resin covering the second major surface of said semiconductor chip and said plurality of protruding electrodes; and a connecting board having a first major surface and a second major surface, said connecting board including a plurality of electrode regions on the first major surface of said connecting board and a plurality of external electrodes having a third thickness on the second major surface of said connecting board, said electrode regions being electrically connected to corresponding external electrodes and directly connected to corresponding connecting terminals, wherein major portions of said protruding electrodes are a first material having a melting point T1, major portions of said external electrodes are a second material having a melting point T2, T2<T1, each of said connecting terminals includes a first region of said first material and a second region of said second material, and said first regions of said connecting terminals are directly connected to corresponding protruding electrodes.

10. The semiconductor device of claim 9, wherein said resin entirely covers said semiconductor chip.

11. The semiconductor device of claim 9, wherein each of said protruding electrodes includes a forward end, each forward end including a flat conductive pattern at a surface of said resin, said conductive patterns of said protruding electrodes being directly connected to corresponding connecting terminals.

12. The semiconductor device of claim 11, wherein each of said electrode regions includes a second conductive pattern and each of said external electrodes includes a third conductive pattern directly connected to the second major surface of said connecting board.

13. The semiconductor device of claim 12, wherein said resin is disposed on the first major surface of said connecting board covering said connecting terminals and said electrode regions.

14. A semiconductor device comprising:

a semiconductor chip having a first major surface and a second major surface, said semiconductor chip including a plurality of protruding electrodes having a first thickness and disposed on the second major surface;

a plurality of connecting terminals having a second thickness and directly connected to corresponding protruding electrodes;

a resin covering the second major surface of said semiconductor chip and said plurality of protruding electrodes; and a connecting board having a first major surface and a second major surface, said connecting board including a plurality of electrode regions on the first major surface of said connecting board and a plurality of external electrodes having a third thickness on the second major surface of said connecting board, said electrode regions being electrically connected to corresponding external electrodes and directly connected to corresponding connecting terminals, wherein T1>T2>T3 and T1, T2, and T3 are the melting points of portions of said protruding electrodes, said connecting terminals, and said external electrodes, respectively.

15. The semiconductor device of claim 14, wherein said resin entirely covers said semiconductor chip.

16. The semiconductor device of claim 14, wherein each of said protruding electrodes includes a forward end, each forward end including a flat conductive pattern at a surface of said resin, said conductive patterns of said protruding electrodes being directly connected to corresponding connecting terminals.

17. The semiconductor device of claim 16, wherein each of said electrode regions includes a second conductive pattern and each of said external electrodes includes a third conductive pattern directly connected to the second major surface of said connecting board.

18. The semiconductor device of claim 17, wherein said resin is disposed on the first major surface of said connecting board covering said connecting terminals and said electrode regions.

* * * * *